United States Patent
Gong (10) Patent No.: US 11,520,563 B2
(45) Date of Patent: Dec. 6, 2022

(54) APPARATUS AND METHOD FOR TRANSFORMING MATRIX, AND DATA PROCESSING SYSTEM

(71) Applicant: Beijing Baidu Netcom Science And Technology Co., LTD., Beijing (CN)

(72) Inventor: Xiaozhang Gong, Beijing (CN)

(73) Assignee: Beijing Baidu Netcom Science and Technology Co., Ltd.

( * ) Notice: Subject to any disclaimer, the term of this patent is extended or adjusted under 35 U.S.C. 154(b) by 399 days.

(21) Appl. No.: 16/711,277

(22) Filed: Dec. 11, 2019

(65) Prior Publication Data

US 2020/0412382 A1 Dec. 31, 2020

(30) Foreign Application Priority Data

Jun. 26, 2019 (CN) .......................... 201910559362.7

(51) Int. Cl.
*G06F 7/78* (2006.01)
*H03M 13/27* (2006.01)
*G06F 17/16* (2006.01)
*H03M 13/11* (2006.01)

(52) U.S. Cl.
CPC ............. *G06F 7/78* (2013.01); *G06F 17/16* (2013.01); *H03M 13/2782* (2013.01); *H03M 13/1137* (2013.01); *H03M 13/1185* (2013.01)

(58) Field of Classification Search
CPC ....... G06F 7/78; G06F 17/16; H03M 13/2782
See application file for complete search history.

(56) References Cited

U.S. PATENT DOCUMENTS

| 5,719,875 A * | 2/1998 | Wei ................ H03M 13/23 714/701 |
| 2009/0031089 A1 | 1/2009 | Tuominen |
| 2011/0264723 A1 | 10/2011 | Yagain |
| 2018/0336163 A1 | 11/2018 | Phelps et al. |
| 2019/0012295 A1 * | 1/2019 | Yinger ................ G06F 17/16 |

FOREIGN PATENT DOCUMENTS

| CN | 109150196 A | 1/2019 |
| EP | 3 364 307 A1 | 8/2018 |
| KR | 20180091850 A | 8/2018 |

OTHER PUBLICATIONS

Sung et al., "In-place transposition of rectangular matrices on accelerators," BNSDOCID: <XP_ .58044703A1_>, pp. 207-218.
KR Decision to Grant dated Sep. 1, 2021 issued in KR Application No. 10-2020-0003639.

\* cited by examiner

*Primary Examiner* — Joseph D Torres
(74) *Attorney, Agent, or Firm* — Weaver Austin Villeneuve & Sampson LLP (57) ABSTRACT

Disclosed are an apparatus and method for transforming a matrix, and a data processing system. The apparatus may include: a first shift unit, configured to receive matrix data and perform first cyclic shift on the matrix data to generate first data; a cache unit, configured to write each row of data into the cache unit in the first data thereto in an order different from the order of respective data in the row of data to store the first data as second data; and a second shift unit, configured to read the second data from the cache unit and perform second cyclic shift on the second data to generate transformed matrix data.

14 Claims, 8 Drawing Sheets

APPARATUS AND METHOD FOR TRANSFORMING MATRIX, AND DATA PROCESSING SYSTEM

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

TECHNICAL FIELD

Embodiments of the present disclosure mainly relate to the field of matrix data processing, and more specifically to an apparatus and method for transforming a matrix, and a data processing system including the apparatus.

BACKGROUND

In a deep learning accelerator, data such as the most core features, model parameters, and intermediate results as input data are represented in a matrix format, such as a one-dimensional matrix, a two-dimensional matrix, and multi-dimensional matrices. The unit that a central processing unit (CPU) usually processes in each clock cycle is one digit, while the processing capacity of the deep learning accelerator is dozens of or even hundreds of times that of the conventional CPU. Therefore, the unit that the deep learning accelerator processes in each clock cycle is not one digit, but a multi-dimensional matrix, such as a matrix block or sub-matrix of an input matrix.

Generally, a deep learning model is a complicated computational process that requires some format changes and arrangements for data of the matrix in order to achieve better performance. In matrix transformation, matrix transposition is the most frequently used operation. Such operation does not change the data inside the matrix, but adjusts the dimensions of the matrix and the order of the data.

It is desirable to provide a high-performance and low-cost matrix transformation scheme in the hardware design of the deep learning accelerator.

SUMMARY

Embodiments of the present disclosure provides an apparatus and method for transforming a matrix, a data processing system including the apparatus, which can provide a scheme for implementing transformation of a multi-dimensional matrix in a deep learning accelerator, and has the characteristics of streaming, simple circuit, low power consumption and the like.

According to a first aspect of the present disclosure, an apparatus for transforming a matrix is provided. The apparatus including: a first shift unit, configured to receive matrix data and perform first cyclic shift on the matrix data to generate first data; a cache unit, configured to write each row of data in the first data into the cache unit in an order different from the order of respective data in the row of data to store the first data as second data; and a second shift unit, configured to read the second data from the cache unit and perform second cyclic shift on the second data to generate transformed matrix data.

According to a first aspect of the present disclosure, a data processing system is provided. The data processing system including: the above described apparatus; an input and output interface, electrically coupled to the apparatus and configured to transmit the matrix data to the apparatus; and a deep learning processing module, electrically coupled to the apparatus and configured to process the transformed matrix data based on a deep learning model.

According to a first aspect of the present disclosure, a method for transforming a matrix is provided. The method including: receiving matrix data, and performing first cyclic shift on the matrix data to generate first data; writing each row of data in the first data into a cache unit in an order different from the order of respective data in the row of data to store the first data in the cache unit as second data; and reading the second data from the cache unit, and performing second cyclic shift on the second data to generate transformed matrix data.

It should be understood that the content described in the summary part is not intended to limit the key or important features of the embodiments of the present disclosure, nor is it intended to limit the scope of the present disclosure. Other features of the present disclosure will become easy to understand by the following description.

BRIEF DESCRIPTION OF THE DRAWINGS

The above and other features, advantages and aspects of various embodiments of the present disclosure will become more apparent with reference to the accompanying drawings and detailed descriptions below. The same or similar reference signs in the drawings denote the same or similar elements, in which.

DETAILED DESCRIPTION OF EMBODIMENTS

Embodiments of the present disclosure will be described in more detail below with reference to the accompanying drawings. Although some embodiments of the present disclosure are shown in the drawings, it should be appreciated that the present disclosure may be implemented in various forms and should not be construed as limited to the embodiments described here. Instead, these embodiments are provided for more thorough and complete understanding of the present disclosure. It should be understood that the drawings and embodiments of the present disclosure are merely illustrative, but are not intended to limit the scope of the present disclosure.

In the description of the embodiments of the present disclosure, the term "include" and the like should be interpreted as open inclusion, i.e., "include but not limited to". The term "based on" should be interpreted as "at least partially based on". The term "one embodiment" or "the embodiment" should be interpreted as "at least one embodiment." The terms "first", "second" and the like may indicate different or identical objects. Other explicit and implicit definitions may also be included below.

As mentioned above, the input of a deep learning accelerator is usually matrix data, and in the calculation process of a deep learning model, the matrix data needs to be transformed. In a conventional scheme, dimensional expansion, transposition, and the like of a matrix are implemented through preprocessing or co-processing of a software displayed by a general-purpose processor (CPU or ARM). However, this scheme is poor in matrix conversion performance, increases user's codes, and is inconvenient to use. Furthermore, in another conventional scheme, matrix transposition is implemented by a register array, where an N×N matrix is shifted longitudinally into the register array and then laterally shifted out of the register array to achieve transposition of the matrix. However, this scheme consumes a large number of registers, cannot support dimensional expansion of matrices, cannot support transposition of matrices of more than three dimensions, and is poor in flexibility.

The hardware design of the deep learning accelerator includes FPGA circuit design or ASIC chip design or the like. It is a difficulty how to achieve a high-performance and low-cost matrix transformation circuit, and to flexibly support multiple matrix transformations such as transposition of a two-dimensional matrix, transposition of a three-dimensional matrix, and dimension expansion and transposition of matrices.

Some embodiments of the present disclosure provide an apparatus for transforming a matrix, where a first shift unit receives matrix data and performs first cyclic shift on the matrix data to generate first data, a cache unit stores the first data as second data by writing each row of data in the first data into the cache unit in an order different from the order of respective data in the row of data, and a second shift unit reads the second data from the cache unit and performs second cyclic shift on the second data to generate transformed matrix data. In this way, embodiments of the present disclosure provide a scheme for implementing transformation of a multi-dimensional matrix in a deep learning accelerator, which supports multiple matrix transformations such as transposition of a two-dimensional matrix, transposition of a three-dimensional matrix, and dimension expansion and transposition of matrices, and has the characteristics of streaming, simple circuit, low power consumption and the like.

The present disclosure will be described in detail below with reference to various embodiments in combination with the accompanying drawings.

Figure 1:
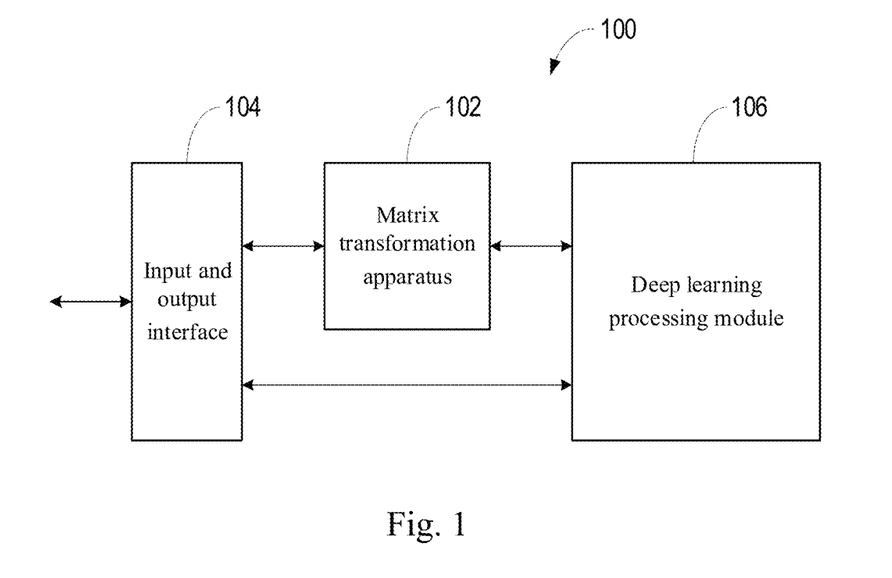
FIG. 1 is a block diagram of a data processing system according to an embodiment of the present disclosure.

FIG. 1 is a block diagram of a data processing system according to an embodiment of the present disclosure. The data processing system 100 shown in FIG. 1 may be implemented in a deep learning accelerator. Referring to FIG. 1, the data processing system 100 may include a matrix transformation apparatus 102, an input and output interface 104, and a deep learning processing module 106.

The input and output interface 104 is configured to receive matrix data from the outside of the data processing system 100 and send the processing result of the data processing system 100 to the outside of the data processing system 100. In some embodiments, the input and output interface 104 is configured to read matrix data from an external memory and write data representing the processing result into the external memory. In some embodiments, the input and output interface 104 is configured to receive matrix block data or sub-matrix data. Furthermore, the input and output interface 104 is further configured to transmit the received matrix data to the matrix transformation apparatus 102.

The matrix transformation apparatus 102 is electrically coupled to the input and output interface 104. The matrix transformation apparatus 102 is configured to receive matrix data and transform the matrix data to generate transformed matrix data. In some embodiments, the matrix transformation apparatus 102 is configured to transform the format of the matrix data. In some embodiments, the matrix transformation apparatus 102 is configured to perform a plurality of matrix transformations such as transposition of a two-dimensional matrix, transposition of a three-dimensional matrix, and dimension expansion and transposition of matrices. In some embodiments, the matrix transformation apparatus 102 is further configured to transmit the transformed matrix data to the deep learning processing module 106 for computing. Detailed configuration of the matrix transformation apparatus 102 will be described later.

The deep learning processing module 106 is electrically coupled to the matrix transformation apparatus 102. The deep learning processing module 106 is configured to process transformed matrix data based on a deep learning model. In some embodiments, the deep learning processing module 106 is configured to perform various matrix calculations, vector calculations, non-linear calculations, and the like. In some embodiments, the deep learning processing module 106 is configured as an intellectual property (IP) core which is based on a deep learning model and is known in the art.

In some embodiments, the deep learning processing module 106 is further configured to transmit the processing result as another matrix data to the matrix transformation apparatus 102. In some embodiments, the matrix transformation apparatus 102 is further configured to generate transformed another matrix data based on the another matrix data and transmit the transformed another matrix data to the input and output interface 104 for outputting the transformed another matrix data to an external apparatus.

In some embodiments, the deep learning processing module 106 is directly electrically coupled to the input and output interface 104, and is further configured to transmit the processing result directly to the input and output interface 104 for outputting the processing result to an external apparatus. In some embodiments, the deep learning processing module 106 is further configured to receive matrix data directly from the input and output interface 104 and process the matrix data.

In some embodiments, the data processing system 100 operates in a streamlined way, where during the matrix transformation apparatus 102 transforms the current matrix data, the input and output interface 104 may receive next matrix data, while the deep learning module 106 may process the previous transformed matrix data.

Figure 2A:
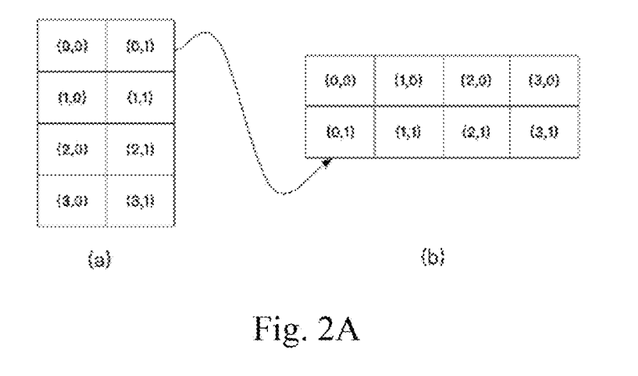
FIG. 2A to FIG. 2C are schematic diagrams of matrix transformations.
Figure 2B:
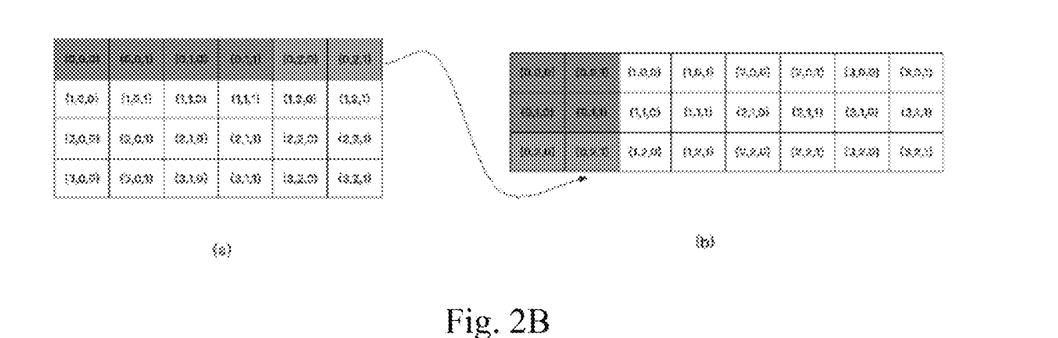
Figure 2C:
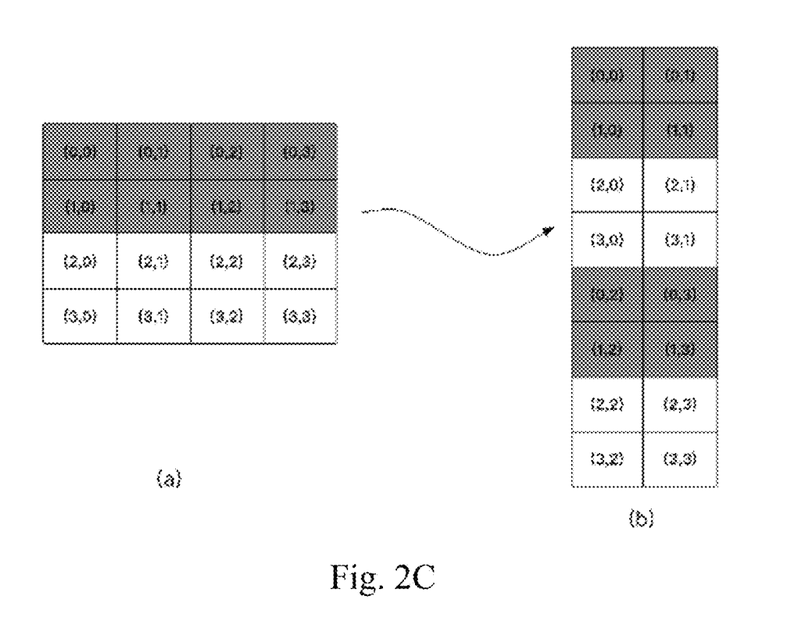

FIG. 2A to FIG. 2C are schematic diagrams of matrix transformation performed by the matrix transformation apparatus. Generally, a two-dimensional matrix is represented by [n, m], where n represents the size of a first dimension and m represents the size of a second dimension. In addition, a three-dimensional matrix is represented by [n, m, k], and so on.

FIG. 2A shows matrix(a) [4, 2] and matrix(b) [2, 4], where the left matrix [4, 2] is transposed to the right matrix [2, 4]. (0, 0) data in the matrix data represents the first column of the first row data, (2, 1) data represents the second column of the third row data, and so on. FIG. 2A shows transposition of a two-dimensional matrix [n, m].

FIG. 2B shows matrix(a) [4, 3, 2] and matrix(b) [3, 4, 2], where the left matrix [4, 3, 2] is transposed to the right matrix [3, 4, 2]. FIG. 2B shows transposition of a three-dimensional matrix [n, m, k].

FIG. 2C shows matrix (a) [4, 4] and matrix (b) [2, 4, 2], where the left matrix [4, 4] is first dimensionally expanded into [4, 2, 2], and then the dimensionally expanded matrix is transposed to the right matrix [2, 4, 2]. FIG. 2C shows a transformation in which a two-dimensional matrix is expanded into a three-dimensional matrix and the three-dimensional matrix is then transposed.

Figure 3:
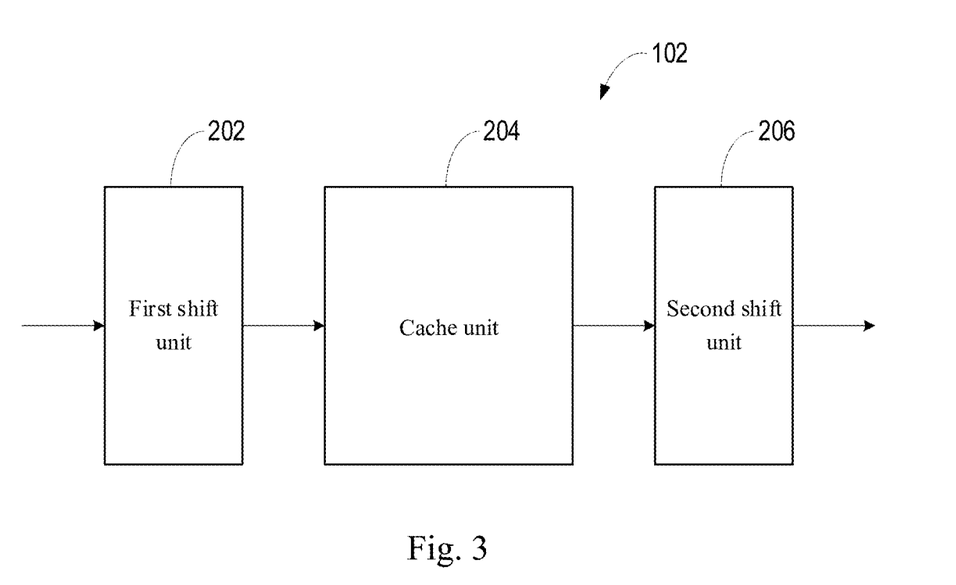
FIG. 3 is a block diagram of a matrix transformation apparatus according to an embodiment of the present disclosure.

FIG. 3 is a block diagram of a matrix transformation apparatus according to an embodiment of the present disclosure. Referring to FIG. 3, the matrix transformation apparatus 102 includes a first shift unit 202, a cache unit 204, and a second shift unit 206.

The first shift unit 202 is configured to receive matrix data and perform first cyclic shift on the matrix data to generate first data. In some embodiments, the first shift unit 202 is configured to perform first cyclic shift on each row of the matrix data, respectively. In some embodiments, the first shift unit 202 is configured to cyclically shift the i-th row of data in the matrix data to right by (i−1) bits to generate first data.

The cache unit 204 is electrically coupled to the first shift unit 202, and is configured to control writing of the first data to the cache unit 204, to store the first data as second data. The cache unit 204 writes each row of data in the first data into the cache unit 204 in an order different from the order of the respective data in the row of data. In some embodiments, the cache unit 204 includes a memory controller and a memory cell group, where the memory controller controls writing of the first data into the memory cell group. In some embodiments, the cache unit 204 includes a plurality of memory cell groups, each memory cell group includes a plurality of memory addresses, and the cache unit 204 is further configured to write respective rows of data in the first data into different memory addresses of different memory cell groups to store the first data as second data. It should be understood that, since the first data is not written into the cache unit 204 in the original order of rows and columns, so the second data stored in the cache unit 204 is data after the order or format of the first data is changed. However, compared with the first data, the content of each piece of the second data does not change. Writing of the first data to the cache unit will be described in detail later.

The second shift unit 206 is electrically coupled to the cache unit 204, and is configured to read the second data from the cache unit 204 and perform second cyclic shift on the second data to generate transformed matrix data. In some embodiments, the second shift unit 206 is configured to read the data stored at same memory addresses of different memory cell groups in the second data respectively, to use as corresponding rows of data in the second data. In some embodiments, the second shift unit 206 is configured to perform second cyclic shift on each row of data in the second data, to generate a corresponding row of data in the transformed matrix data. In some embodiments, the second shift unit 206 is configured to cyclically shift the i-th row of data in the second data to left by (i−1) bits to generate transformed matrix data. Moreover, the second shift unit 206 is further configured to transmit the transformed matrix data to the deep learning processing module 106 of FIG. 1.

Figure 4:
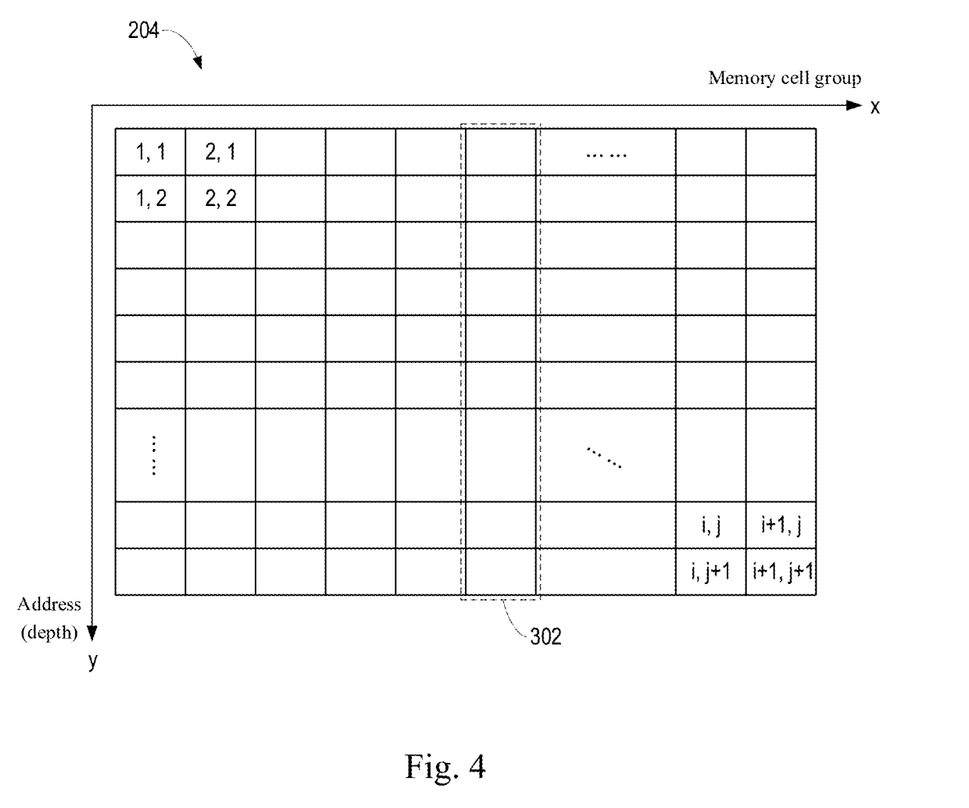
FIG. 4 is a schematic diagram of a cache unit according to an embodiment of the present disclosure.

FIG. 4 is a schematic diagram of a cache unit according to an embodiment of the present disclosure. Referring to FIG. 4, the cache unit 204 includes a plurality of memory cell groups 302.

As shown in FIG. 4, in some embodiments, the plurality of memory cell groups 302 are sequentially arranged along an x-axis, and the x-axis represents the i-th memory cell group 302. In addition, each memory cell group 302 includes a plurality of memory addresses. For convenience of description, in some embodiments, the plurality of memory addresses of a memory cell group 302 are shown as arranged along a y-axis orthogonal to the x-axis, and the y-axis represents the j-th memory addresses of the memory cell groups 302. In some embodiments, the memory address may also be referred to as depth. In some embodiments, the memory address [i, j] represents the j-th memory address of the i-th memory cell group 302. Here, i and j are natural numbers, respectively.

In some embodiments, the memory cell group 302 is a static random access memory (SRAM) group. Hereinafter, the memory cell group 302 will be described as an example of an SRAM group. It should be understood that the memory cell group 302 is not limited to the SRAM group, and may also be other type of memory cell set.

Figure 5:
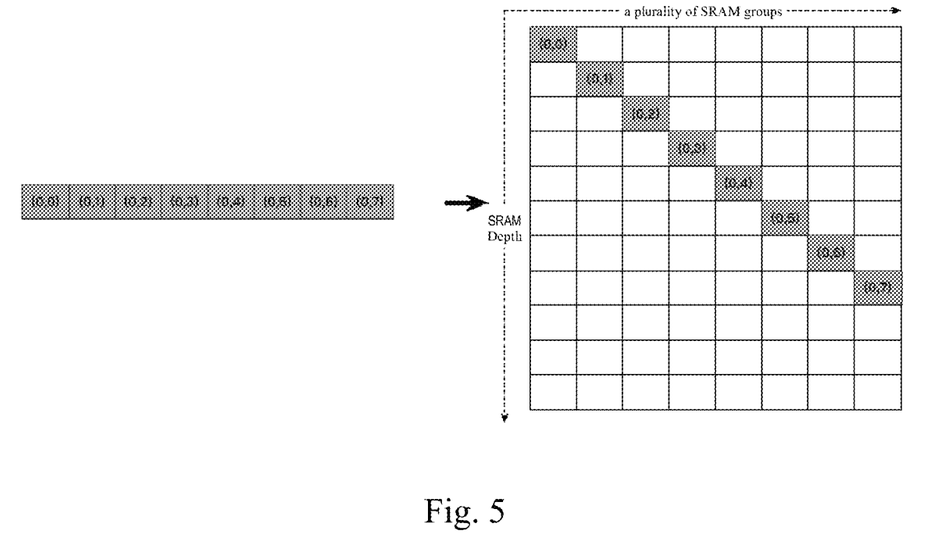
FIG. 5 is a schematic diagram of a matrix transformation process according to an embodiment of the present disclosure.

FIG. 5 is a schematic diagram of a matrix transformation process according to an embodiment of the present disclosure. The left data shown in FIG. 5 is the first row of data (0, 0), (0, 1), (0, 2), (0, 3), (0, 4), (0, 5), (0, 6), (0, 7) in the matrix data. In some embodiments, the first shift unit 202 reads the first row of data from the matrix data, and cyclically shifts the first row of data to the right by (1−1=0) bits, i.e., substantially does not cyclically shift the first row of data to the right. The cache unit 204 controls the writing of the first row of data, and writes the first row of data into the cache unit 204 at the first diagonal memory addresses. In some embodiments, the cache unit 204 writes the first row of data into the memory addresses [1, 1], [2, 2], [3, 3], [4, 4], [5, 5], [6, 6], [7, 7], [8, 8] of a plurality of memory cell groups respectively, as shown in FIG. 5. In this way, the first row of data in the matrix data is stored into the cache unit 204 at the first diagonal memory addresses instead in the original format or order.

Figure 6:
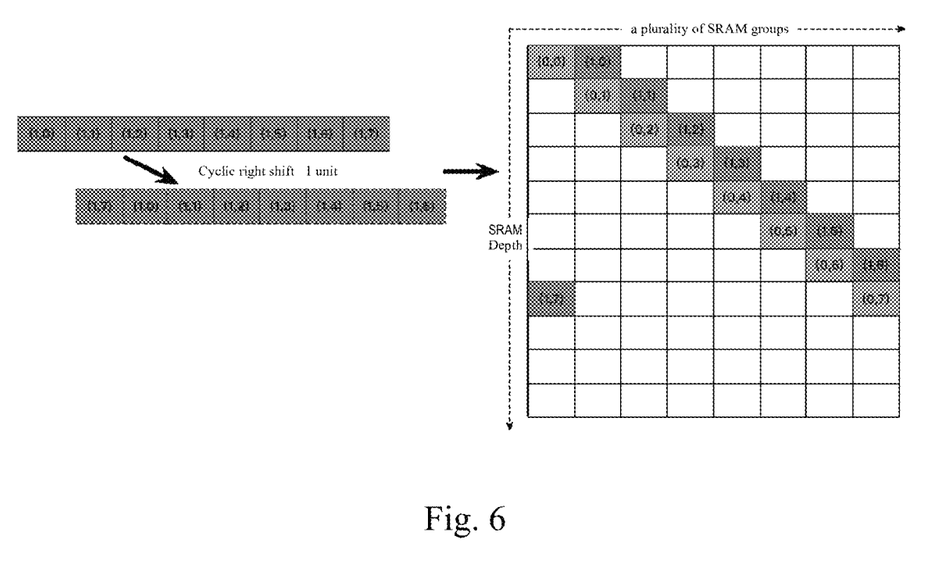
FIG. 6 is a schematic diagram of a matrix transformation process according to an embodiment of the present disclosure.

FIG. 6 is a schematic diagram of a matrix transformation process according to an embodiment of the present disclosure. The left data shown in FIG. 6 is the second row of data in the matrix data. In some embodiments, the first shift unit 202 reads the second row of data from the matrix data, and cyclically shifts the second row of data to the right by (2−1=1) bits, to obtain a second row of data after being cyclic right shifted of 1 bit (1, 7), (1, 0), (1, 1), (1, 2), (1, 3), (1, 4), (1, 5), (1, 6). The cache unit 204 controls the writing of the second row of data after the cyclic right shift, and writes the second row of data after the cyclic right shift into the cache unit 204 at second diagonal memory addresses. In some embodiments, the cache unit 204 writes the second row of data after the cyclic right shift into the memory addresses [1, 8], [2, 1], [3, 2], [4, 3], [5, 4], [6, 5], [7, 6], [8, 7] of a plurality of memory cell groups, respectively, as shown in FIG. 6. In this way, the second row of data after the cyclic right shift in the matrix data is stored into the cache unit 204 at the second diagonal memory addresses instead in the original format or order.

Figure 7:
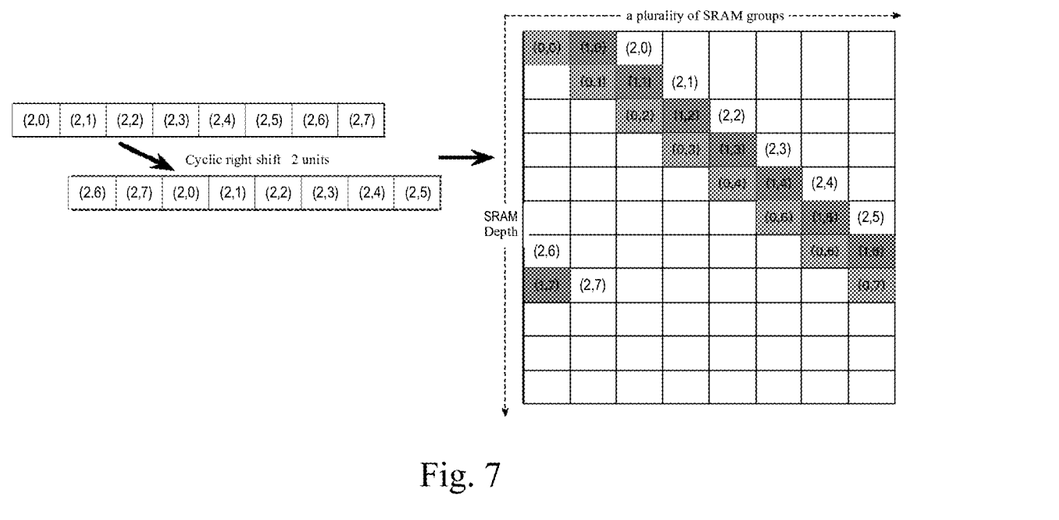
FIG. 7 is a schematic diagram of a matrix transformation process according to an embodiment of the present disclosure.

FIG. 7 is a schematic diagram of a matrix transformation process according to an embodiment of the present disclosure. The left data shown in FIG. 7 is the third row of data in the matrix data. In some embodiments, the first shift unit 202 reads the third row of data from the matrix data, and cyclically shifts the third row of data to the right by (3−1=2) bits to obtain a third row of data after being cyclic right shifted of 2 bits (2, 6), (2, 7), (2, 0), (2, 1), (2, 2), (2, 3), (2, 4), (2, 5). The cache unit 204 controls the writing of the third row of data after the cyclic right shift, and writes the third row of data after the cyclic right shift into the cache unit 204 at third diagonal memory addresses. In some embodiments, the cache unit 204 writes the third row of data after the cyclic right shift into the memory addresses [1, 7], [2, 8], [3, 1], [4, 2], [5, 3], [6, 4], [7, 5], [8, 6] of a plurality of memory cell groups, respectively, as shown in FIG. 7. In this way, the third row of data after the cyclic right shift in the matrix data is stored into the cache unit 204 at the third diagonal memory addresses instead in the original format or order.

In some embodiments, by parity of reasoning, the first shift unit 202 reads the i-th row of data from the matrix data, and cyclically shifts the i-th row of data to the right by (i−1) bits. The cache unit 204 controls the writing of the i-th row of data after the cyclic right shift, and writes the i-th row of data after the cyclic right shift into the cache unit 204 at i-th diagonal memory addresses. Here, given a matrix represented by the matrix data includes n rows and m columns, where n and m are natural numbers, respectively. In some embodiments, the cache unit 204 writes the j-th data in the m column data of the i-th row of data after the cyclic right shift into the (m+j−i+1)-th memory address (where j is greater than or equal to 1 and less than or equal to i−1) and the (j−i+1)-th memory address (where j is greater than or equal to i and less than or equal to m) of the j-th memory cell group, where i is greater than or equal to 2 and less than or equal to n. Further, when i is equal to 1, as described above, the j-th data of the m column data of the first row of data is respectively written into the j-th memory address of the j-th memory cell group. In this way, the cache unit 204 controls the writing of respective data in each row of data after the cyclic right shift into different memory addresses of different memory cell groups at corresponding diagonal memory addresses. Thus, the matrix data after the first cyclic shift is stored into the cache unit in a format or order different from its original format or order, which facilitates the generation of the transformed matrix by reading.

Figure 8:
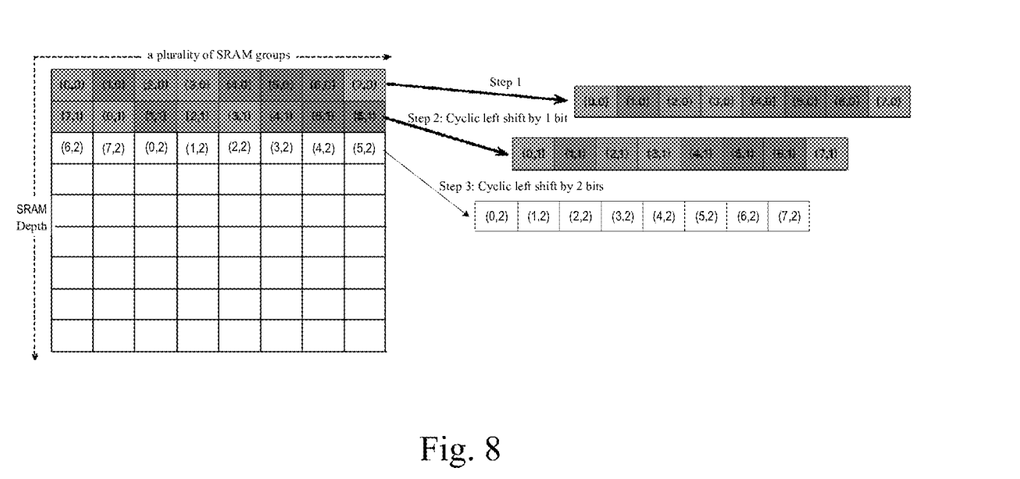
FIG. 8 is a schematic diagram of a matrix transformation process according to an embodiment of the present disclosure.

FIG. 8 is a schematic diagram of a matrix transformation process according to an embodiment of the present disclosure. The left side of FIG. 8 shows a portion of the second data stored in the cache unit 204. In some embodiments, the second shift unit 206 sequentially reads data (0, 0), (1, 0), (2, 0), (3, 0), (4, 0), (5, 0), (6, 0), (7, 0) stored at the first memory addresses of different memory cell groups from the cache unit 204, to use as the first row of data in the second data. Then, the second shift unit 206 cyclically shifts the first row of data in the second data to the left by (1−1=0) bits, i.e., substantially does not cyclically shift the first row of data in the second data to the left. The second shift unit 206 outputs the first row of data in the second data as a first row of data in the transformed matrix data.

In some embodiments, the second shift unit 206 sequentially reads data (7, 1), (0, 1), (1, 1), (2, 1), (3, 1), (4, 1), (5, 1), (6, 1) stored at the second memory addresses of different memory cell groups from the cache unit 204, to use as the second row of data in the second data. The second shift unit 206 cyclically shifts the second row of data in the second data to the left by (2−1=1) bits to generate a second row of data after being cyclic left shifted (0, 1), (1, 1), (2, 1), (3, 1), (4, 1), (5, 1), (6, 1), (7, 1). The second shift unit 206 outputs the second row of data after being cyclic left shifted in the second data as a second row of data in the transformed matrix data.

In some embodiments, the second shift unit 206 sequentially reads data (6, 2), (7, 2), (0, 2), (1, 2), (2, 2), (3, 2), (4, 2), (5, 2) stored at the third memory addresses of different memory cell groups from the cache unit 204, to use as a third row of data in the second data. The second shift unit 206 cyclically shifts the third row of data in the second data to the left by (3−1=2) bits to generate a third row of data after being cyclic left shifted (0, 2), (1, 2), (2, 2), (3, 2), (4, 2), (5, 2), (6, 2), (7, 2). The second shift unit 206 outputs the third row of data after the cyclic left shift in the second data as a third row of data in the transformed matrix data.

In some embodiments, by parity of reasoning, the second shift unit 206 sequentially reads the data stored at same memory addresses of different memory cell groups in the second data from the cache unit 204, respectively, to use as corresponding rows of data in the second data. Then, the second shift unit 206 cyclically shifts the i-th row of data in the second data to the left by (i−1) bits to generate a corresponding row of data in the transformed matrix data. In this way, the matrix transformation apparatus 102 outputs the transposed matrix data.

In some embodiments, when n of the matrix [n, m] is smaller than or equal to m, the matrix data may be first cyclically shifted to generate first data according to the above described method, the first data is controlled to be written and stored as second data, and each row of data in the second data is read and second cyclically shifted to generate a transformed matrix. For example, when n is equal to 3 and m is equal to 8, each row of the matrix data is cyclically shifted to the right and written as shown in FIG. 7. In some embodiments, the second shift unit 206 reads data (0, 0), (1, 0), (2, 0), (dummy), (dummy), (dummy), (dummy), (dummy) stored at the first memory addresses of different memory cell groups, data (dummy), (0, 1), (1, 1), (2, 1), (dummy), (dummy), (dummy), (dummy) stored at the second memory addresses, . . . and data (1, 7), (2, 7), (dummy), (dummy), (dummy), (dummy), (dummy), (0, 7) stored at the eighth memory addresses, respectively, to use as corresponding rows of data in the second data, where dummy represents dummy data, which is omitted when output from the matrix transformation apparatus 102. The second shift unit 206 cyclically shifts the i-th row of data in the second data to the left by (i−1) bits to output transformed matrix data including a first row of data (0, 0), (1, 0), (2, 0), a second row of data (0, 1), (1, 1), (2, 1), . . . and an eighth row of data (0, 7), (1, 7), (2, 7). In this way, the matrix transformation apparatus 102 outputs a transposed matrix [8, 3] of the matrix [3, 8].

In some embodiments, when n is greater than m, the first shift unit 202 splits the matrix [n, m] into a matrix [m, m] and a matrix [n-m, m], then the matrix [m, m] is transformed according to the above descried method, and a transformed first matrix is output. For the matrix [n-m, m], the matrix data after being first cyclic shifted is written into the cache unit 204 with (m+1)-th memory addresses of a plurality of memory cell groups as start addresses, and the matrix [n-m, m] is transformed according to the above descried method, the second shift unit read the data starting from the (m+1)-th memory addresses, and after the second cyclic shift is performed on the read data, a transformed second matrix is output. Subsequently, the first matrix and the second matrix may be combined to generate a transposed matrix.

In some embodiments, when m is greater than the total data width k of the cache unit 204, the first shift unit 202 splits the matrix [n, m] into a matrix [n, k] and a matrix [n, m-k], the matrix [n, k] is transformed according to the above descried method, and a transformed first matrix is output. For the matrix [n, m-k], the matrix data after first cyclic shifted is written into the cache unit 204 with (k+1)-th memory addresses of the memory cell groups as start addresses, the matrix [n, m-k] is transformed according to the above descried method, where the second shift unit read the data starting from the (k+1)-th memory addresses, after the second cyclic shift is performed on the read data, a transformed second matrix is output. Subsequently, the first matrix and the second matrix may be combined to generate a transposed matrix.

In some embodiments, contrary to the above method of writing diagonally and then reading data in the row direction, respective rows of data in the first data may be first stored at same address of different memory cell groups, and then the data stored in the cache unit is read from corresponding diagonals to generate a transformed matrix.

In some embodiments, a desired matrix transformation, including dimensional transformation, data position transformation, data exchange, etc., may be performed by desirably setting the write addresses in the cache unit of rows of data in the first data and/or changing the reading method.

Figure 9:
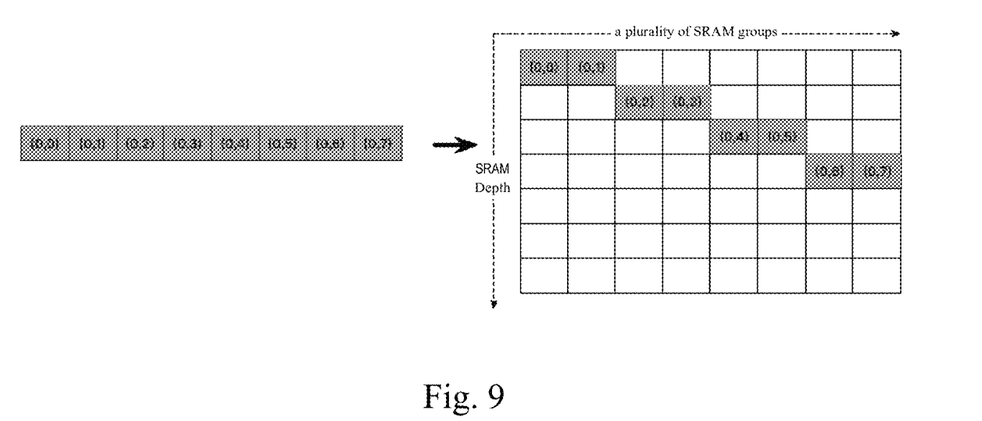
FIG. 9 is a schematic diagram of a matrix transformation process according to another embodiment of the present disclosure.
Figure 10:
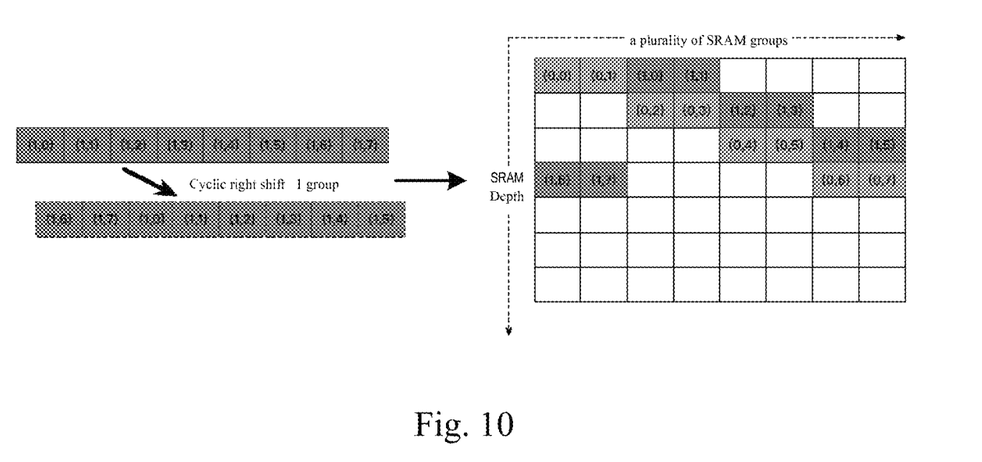
FIG. 10 is a schematic diagram of a matrix transformation process according to another embodiment of the present disclosure.

FIG. 9 and FIG. 10 are schematic diagrams of a matrix transformation process according to another embodiment of the present disclosure. FIG. 9 and FIG. 10 show an example of a process of first expanding a matrix [n, m] to [n, p, q] and then transforming the matrix [n, p, q].

In some embodiments, every s memory cell groups among the plurality of memory cell groups 302 are divided into a set of memory cell groups, and each set of memory cell groups includes a plurality of memory addresses. In some embodiments, every t memory addresses among the plurality of memory addresses are divided into a set of memory addresses. In some embodiments, the cache unit 204 is further configured to write a plurality of sets of data in every t rows of data in the first data into different sets of memory addresses of different sets of memory cell groups respectively, to store the first data as second data, where each set of data of the plurality of sets of data includes s×t data, and s and t are natural numbers.

In some embodiments, the first shift unit 202 is further configured to divide every s data in each row of the matrix data into a set of data, and cyclically shift each set of data in the i-th row of the matrix data to the right by (i−1)×s bits, to generate first data.

In some embodiments, the second shift unit 206 is further configured to sequentially read the respective sets of data stored at same sets of memory addresses of different sets of memory cell groups in the second data respectively, to use as corresponding rows of data in the second data. In some embodiments, the second shift unit 206 performs second cyclic shift on a row of data in the second data to generate a corresponding row of data in the transformed matrix data. In some embodiments, the second shift unit 206 is further configured to cyclically shift each set of data in the i-th row of the second data to the left by (i−1)×s bits, i.e., (i−1) set.

In the example shown in FIG. 9 and FIG. 10, the input matrix is, for example, a two-dimensional matrix [4, 8], and the matrix transformation apparatus 102 first expands the two-dimensional matrix [4, 8] into a three-dimensional matrix [4, 4, 2]. In some embodiments, every two data in each row of data are divided into a set of data, every two memory cell groups are divided into a set of memory cell groups, and the same memory addresses of different sets of memory cell groups are divided into a set of memory addresses.

Referring to FIG. 9, the first shift unit 202 cyclically shifts the four sets of data in the first row of data to the right by (1−1=0)×2 bits, that is, substantially does not cyclically shifts to the right. The cache unit 204 writes the four sets of data {(0, 0), (0, 1)}, {(0, 2), (0, 3)}, {(0, 4), (0, 5)}, {(0, 6), (0, 7)} in the first row of data into the first memory addresses of the first and second memory cell groups, the second memory addresses of the third and fourth memory cell groups, the third memory addresses of the fifth and sixth memory cell groups, and the fourth memory addresses of the seventh and eighth memory cell groups, respectively, as shown in FIG. 9.

Referring to FIG. 10, the first shift unit 202 cyclically shifts the four sets of data {(1, 0), (1, 1)}, {(1, 2), (1, 3)}, {(1, 4), (1, 5)}, {(1, 6), (1, 7)} in the second row of data to the right by (2−1=1)×2 bits, i.e., 2 bits or one set, to generate a second row of data after being cyclic right shifted {(1, 6), (1, 7)}, {(1, 0), (1, 1)}, {(1, 2), (1, 3)}, {(1, 4), (1, 5)}. The cache unit 204 stores the second row of data after being cyclic right shifted to the fourth memory addresses of the first and second memory cell groups, the first memory addresses of the third and fourth memory cell groups, the second memory addresses of the fifth and sixth memory cell groups, and the fourth memory addresses of the seventh and eighth memory cell groups, respectively, as shown in FIG. 10.

By parity of reasoning, first cyclic shift, write, read, and second cyclic shift are performed on the matrix [4, 4, 2] in a similar way with reference to the matrix transformation described in FIG. 5 to FIG. 8, so that the matrix [4, 8] is expanded and transformed to generate the transformed matrix [4, 4, 2].

According to some embodiments of the present disclosure, an apparatus for transforming a matrix is implemented in a deep learning accelerator for a deep learning processing module, where the apparatus is capable of transforming matrix data of a matrix block or a sub-matrix input from an off-chip, and transmitting the transformed matrix data to the deep learning processing module for computing. The apparatus according to the embodiments of the present disclosure can implement a scheme of transformation of a multi-dimensional matrix, which supports a plurality of matrix transformations such as transposition of a two-dimensional matrix, transposition of a three-dimensional matrix, and dimension expansion and transposition of matrices, and has the characteristics of streaming, simple circuit, low power consumption and the like.

Figure 11:
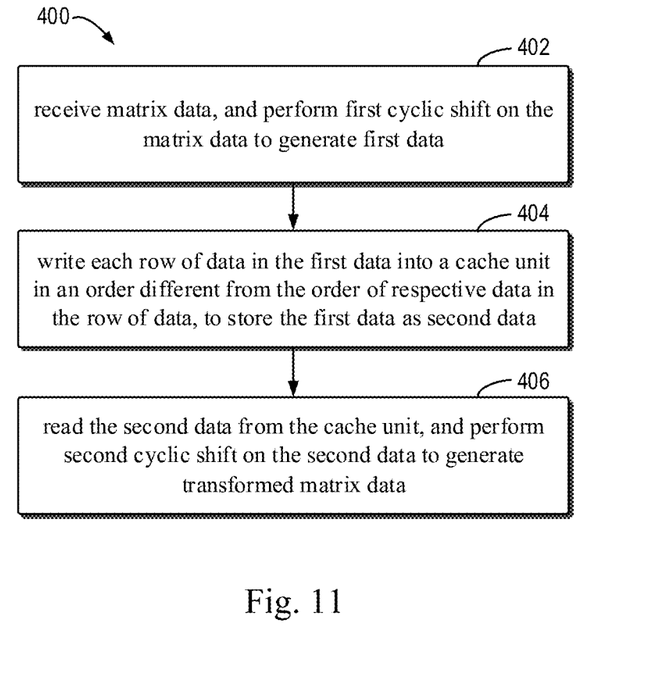
FIG. 11 is a flowchart of a method for transforming a matrix according to an embodiment of the present disclosure.

FIG. 11 is a flowchart of a method for transforming a matrix according to an embodiment of the present disclosure. Referring to FIG. 11, the method 400 for transforming a matrix includes block 402 to block 406.

In block 402, matrix data is received and first cyclic shift is performed on the matrix data to generate first data. In some embodiments, the i-th row of data in the matrix data is cyclically shifted to the right by (i−1) bits to generate first data, where i is a natural number.

In block 404, each row of data in the first data is written into a cache unit in an order different from the order of respective data in the row of data to store the first data in the cache unit as second data. In some embodiments, the cache unit includes a plurality of memory cell groups, and each memory cell group includes a plurality of memory addresses. In some embodiments, rows of data in the first data are written into different memory addresses of different memory cell groups respectively.

In some embodiments, a matrix represented by the matrix data includes n rows and m columns, where n and m are natural numbers, respectively. In some embodiments, the j-th data in the m column data of the first row of the first data is respectively written into the j-th memory address of the j-th memory cell group among the plurality of memory cell groups, respectively, where j is a natural number greater than or equal to 1 and less than or equal to m. Moreover, the j-th data in the m column data of the i-th row of the first data is respectively written into the (m+j−i+1)-th memory address (where j is more than or equal to 1 and less than or equal to i−1) and the (j−i+1)-th memory address (where j is more than or equal to i and less than or equal to m) of the j-th memory cell group among the plurality of memory cell groups, where i is a natural number more than or equal to 2 and less than or equal to n.

In block 406, the second data is read from the cache unit and second cyclic shift is performed on the second data to generate transformed matrix data. In some embodiments, the data stored at same memory addresses of different memory cell groups in the second data are respectively read as corresponding rows of data in the second data. In some embodiments, second cyclic shift is performed on a row of data in the second data to generate a corresponding row of data in the transformed matrix data. In some embodiments, the i-th row of data in the second data is cyclically shifted to the left by (i−1) bits to generate transformed matrix data.

It should be appreciated that the method for implementing the embodiments of the present disclosure may be compiled in one programming language or any combination of a plurality of programming languages, to adapt to an architecture of an on-chip system. In addition, although the operations are described in a specific order, it should be understood that such operations are required to be executed in the specific order shown or executed in sequential order or that all illustrated operations should be executed to achieve desired results. Multitasking and parallel processing may be advantageous in certain circumstances.

The respective units or modules involved in the embodiments of the present disclosure may be implemented by means of software or hardware. The described units or modules may also be provided in a processor, for example, described as: a processor, including a first shift unit, a video evaluation score determining unit, a cache unit and a second shift unit. The names of these units or modules do not in some cases constitute a limitation to such units or modules themselves. For example, the first shift unit may also be described as "a unit configured to receive matrix data and perform first cyclic shift on the matrix data to generate first data".

Although some specific implementation details are contained in the above description, these should not be construed as limiting the scope of the present disclosure. Some features described in the separate embodiments may also be implemented in combination in a single embodiment. Conversely, the various features described in a single embodiment may be implemented alone or implemented in a plurality of embodiments in any suitable combination.

Although the subject has been described in language specific to structural features and/or methodological operations, it should be understood that the subject defined in the appended claims is not necessarily limited to the specific features or operations described above. Instead, the specific features and operations described above are merely in exemplary forms of implementing the claims.

What is claimed is:

1. A data processing system, comprising:
an apparatus for transforming a matrix, comprising: at least one processor; and a memory storing instructions, the instructions when executed by the at least one processor, cause the at least one processor to perform operations, the operations comprising: receiving matrix data and performing first cyclic shift on the matrix data to generate first data; writing each row of data in the first data into one or more memory cell groups in an order different from an order of respective data in the row of data to store the first data as second data; reading the second data from the one or more memory cell groups and performing second cyclic shift on the second data to generate transformed matrix data; and processing the transformed matrix data based on a deep learning model; and
an input and output interface, electrically coupled to the apparatus and configured to transmit the matrix data to the apparatus.

2. The data processing system according to claim 1, wherein the operations further comprise: generating transformed additional matrix data based on the additional matrix data and transmit the transformed additional matrix data to the input and output interface.

3. The data processing system according to claim 1, wherein the operations further comprise: transmitting the processing result to the input and output interface.

4. The data processing system according to claim 1, wherein the one or more memory cell groups comprise a plurality of memory cell groups, each memory cell group comprising a plurality of memory addresses, and the operations further comprise:
writing respective rows of data in the first data into different memory addresses of different memory cell groups respectively to store the first data as the second data.

5. The data processing system according to claim 4, wherein the operations further comprise:
reading the data stored at same memory addresses of different memory cell groups in the second data respectively, to use as corresponding rows of data in the second data; and
performing the second cyclic shift on a row of data in the second data, to generate a corresponding row of data in the transformed matrix data.

6. The data processing system according to claim 5, wherein the operations further comprise:
cyclically shifting an i-th row of data in the matrix data to right by (i−1) bits to generate the first data, wherein i is a natural number; and
cyclically shifting an i-th row of data in the second data to left by (i−1) bits to generate the transformed matrix data.

7. The data processing system according to claim 6, wherein a matrix represented by the matrix data comprises n rows and m columns, wherein n and m are natural numbers respectively, and wherein the operations further comprise:
writing a j-th data in an m column data of a first row of the first data into a j-th memory address of a j-th memory cell group among the plurality of memory cell groups, respectively, wherein j is a natural number greater than or equal to 1 and less than or equal to m; and writing the j-th data in the m column data of an i-th row of the first data into a first memory address and a second memory address of the j-th memory cell group among the plurality of memory cell groups, wherein i is a natural number greater than or equal to 2 and less than or equal to n, and wherein:

when j is greater than or equal to 1 and less than or equal to i-1, the first memory address is the (m+j-i+1)-th memory address; and when j is greater than or equal to i and less than or equal to m, the second memory address is a (j-i+1)-th memory address.

8. The data processing system according to claim 1, wherein the operations further comprise:

splitting the matrix represented by the matrix data into a first matrix comprising p rows and a second matrix comprising q rows, or a first matrix comprising p columns and a second matrix comprising q columns, wherein p and q are natural numbers respectively;

performing the first cyclic shift on the matrix data of the first matrix to generate first data of the first matrix; and performing the first cyclic shift on the matrix data of the second matrix to generate first data of the second matrix.

9. The data processing system according to claim 8, wherein the operations further comprise:

writing the first data of the first matrix into one of the memory cell groups with a first memory address as a start address, to store the first data of the first matrix as the second data of the first matrix; and writing the first data of the second matrix into one of the memory cell groups with a (k+1)-th memory address as a start address, to store the first data of the second matrix as the second data of the second matrix, wherein k is a natural number greater than or equal to p.

10. The data processing system according to claim 9, wherein the operations further comprise:

reading the second data of the first matrix from the one or more memory cell groups, and performing the second cyclic shift on the second data of the first matrix, to generate transformed first matrix data;

reading the second data of the second matrix from the one or more memory cell groups, and performing the second cyclic shift on the second data of the second matrix, to generate transformed second matrix data; and combining the transformed first matrix data and the transformed second matrix data, to generate the transformed matrix data.

11. The data processing system according to claim 1, wherein the one or more memory cell groups comprise a plurality of memory cell groups, every s memory cell groups among the plurality of memory cell groups are divided into a set of memory cell groups, each set of memory cell groups comprises a plurality of memory addresses, every t memory addresses among the plurality of memory addresses are divided into a set of memory addresses, and the operations further comprise:

writing a plurality of sets of data in every t rows of data in the first data into different sets of memory addresses of different sets of memory cell groups respectively, to store the first data as second data, wherein each set of data of the plurality of sets of data comprises s X t data, and s and t are natural numbers.

12. The data processing system according to claim 11, wherein the operations further comprise:

reading respective sets of data stored at same sets of memory addresses of different sets of memory cell groups in the second data respectively, to use as corresponding rows of data in the second data; and performing the second cyclic shift on a row of data in the second data to generate a corresponding row of data in the transformed matrix data.

13. The data processing system according to claim 12, wherein the operations further comprise:

dividing every s data in each row of the matrix data into a set of data, and cyclically shifting each set of data in an i-th row of the matrix data to the right by (i−1) x s bits, to generate the first data, wherein i and s are natural numbers; and cyclically shifting each set of data in an i-th row of the second data to the left by (i−1) X s bits.

14. The data processing system according to claim 1, wherein the matrix represented by the transformed matrix data is a transposed matrix of the matrix represented by the matrix data.

* * * * *

UNITED STATES PATENT AND TRADEMARK OFFICE
CERTIFICATE OF CORRECTION

PATENT NO. : 11,520,563 B2  
APPLICATION NO. : 16/711277  
DATED : December 6, 2022  
INVENTOR(S) : Xiaozhang Gong Page 1 of 1

It is certified that error appears in the above-identified patent and that said Letters Patent is hereby corrected as shown below:

On the Title Page

Item (73), Assignee, delete "Beijing Baidu Netcom Science and Technology Co., Ltd." and insert -- Kunlunxin Technology (Beijing) Company Limited, Beijing (CN) --, therefor.

Signed and Sealed this  
Twenty-fourth Day of September, 2024

Katherine Kelly Vidal  
*Director of the United States Patent and Trademark Office*